(12) United States Patent
Chetlur et al.

(10) Patent No.: US 6,198,301 B1
(45) Date of Patent: Mar. 6, 2001

(54) METHOD FOR DETERMINING THE HOT CARRIER LIFETIME OF A TRANSISTOR

(75) Inventors: Sundar Chetlur, Orlando, FL (US); Merlyne M. De Souza, Leicester (GB); Anthony S. Oates, Orlando, FL (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/121,216

(22) Filed: Jul. 23, 1998

(51) Int. Cl.[7] .................................................. G01R 31/26
(52) U.S. Cl. ............................................ 324/769; 324/765
(58) Field of Search .................................... 324/765, 766, 324/769; 257/48; 438/14, 17

(56) References Cited

U.S. PATENT DOCUMENTS

| | | | |
|---|---|---|---|
| 5,426,375 | * 6/1995 | Roy et al. | 324/769 |
| 5,444,389 | * 8/1995 | Hirae et al. | 324/765 |
| 5,615,377 | * 3/1997 | Shimizu et al. | 324/765 X |
| 5,712,208 | 1/1998 | Tseng et al. | 438/770 |
| 5,764,073 | * 6/1998 | Sadamatsu | 324/765 |
| 5,877,419 | * 3/1999 | Farokhzad | 324/769 X |

* cited by examiner

*Primary Examiner*—Glenn W. Brown

(57) ABSTRACT

The present invention provides a method for determining a hot carrier lifetime of a transistor. In one embodiment, the method comprises the steps of determining an initial transconductance ($g_{m1}$) of a transistor, and then, applying a stress voltage, which does not exceed a maximum breakdown voltage of the transistor, to the transistor to cause a transconductance degradation of the transistor, and then determining a subsequent transconductance ($g_{m2}$) of the transistor. A hot carrier lifetime of the transistor can then be determined as a function of $g_{m1}$ and $g_{m2}$. Thus, the present invention provides a method in which the hot carrier lifetime is determined from sequential transconductance measurements without intervening, transistor characteristic tests that are typically conducted between the transconductance measurements that degrade the sensitivity of the $g_m$ measurement. The present invention provides a method that allows for an accurate determination of the hot carrier lifetime within a very short period of time, and therefore, can be used to monitor the hot carrier lifetime quality of the devices as they are fabricated without substantial increases in production downtime typically required to make hot carrier lifetime measurements.

38 Claims, 3 Drawing Sheets

METHOD FOR DETERMINING THE HOT CARRIER LIFETIME OF A TRANSISTOR

TECHNICAL FIELD OF THE INVENTION

The present invention is directed, in general, to a method for determining certain characteristics of a transistor, and more specifically, to a method for determining the hot carrier lifetime of a transistor.

BACKGROUND OF THE INVENTION

During manufacturing of semiconductor devices, such as transistors, quality control monitoring is implemented to ensure that the fabricated devices are conforming to their design specifications. Typically, the device characteristics, e.g., substrate current ($I_{sub}$), current drain saturation ($I_{DSAT}$), or, current in the linear region ($I_{DLIN}$), etc. are monitored and compared to a predetermined value that is used as a standard. This provides a means of detecting problems and/or failures as early in the fabrication process as possible, to minimize further manufacturing costs. Furthermore, these tests provide early warning of reliability problems to the semiconductor device manufacturers and ultimately help to characterize, benchmark and improve the reliability and quality of the semiconductor integrated circuits (ICs) and processes. It is, therefore, desirable that these tests can be conducted both accurately and quickly to provide the fabrication lines with reliable current feedback.

Although different devices generally have different benchmark standards associated with them, there are certain tests that are universally employed by all these devices. For example, tests that help characterize major IC failure mechanisms, which include oxide integrity, electromigration and transistor degradation, are usually utilized regardless of the device type being fabricated.

Transistor degradation characterization is typically defined using a particular device's hot carrier lifetime. As process geometries shrink, electric fields present within semiconductor devices increase, since the distances, across which electrical potentials act, are diminished. The resultant high magnitude electric fields generate hot carriers that are electrons accelerated to relatively high velocities. A hot carrier lifetime is typically a measurement of the length of time it takes for a semiconductor device to degrade an arbitrary amount. Testing involves monitoring the change in a device characteristics under accelerated bias conditions. Failure is defined as the time when a percentage change, e.g., 15%, in the device characteristic under test. A common device characteristic that is used to determine hot carrier lifetime is linear transconductance ($g_m$). In most applications, the hot carrier lifetime is determined along with the other above-mentioned tests. For example, an initial transconductance measurement, in conjunction with other test measurements, is taken and is then followed by stressing the device and then taking different test measurements again, such as $I_{DSAT}$. Subsequent to these measurements, another transconductance measurement is then taken.

Under these present methods, determining the hot carrier lifetime of a device using the degradation of the device transconductance characteristic generally requires either a significant amount of time or a substantially increased voltage above the operating voltage which could be near the breakdown voltage of the device. Depending on the percentage degradation criteria used, e.g., 10% or 15%, the testing (repeated measurement and stress) period may last as long as 100 hours. These long periods of time are, of course, highly undesirable where "real-time" feedback is needed to keep the quality of the device consistently high.

One common approach to reducing the time period is to increase (substantially above the device's operating voltage) the bias, or stress, voltages applied to the device. Using high stress voltages, however, does not truly reflect the conditions seen by the device in common usage. More significantly, the time required to determine the hot carrier lifetime essentially precludes its use during the fabrication process. Instead, current manufacturing determination of a device's hot carrier lifetime involves measuring the device's $I_{sub}$ characteristic and comparing the measured value with a predetermined value. Unfortunately, however, comparing the value $I_{sub}$ to a baseline value only provides an approximation, since there is no exact correlation between $I_{sub}$ and hot carrier lifetime. Furthermore, as a device's process changes, these changes can affect the device $I_{sub}$ characteristic. In which case, the baseline $I_{sub}$ standard used in the manufacturing process must also be recalculated. Therefore, as it can be seen from the foregoing, the present methods of determining hot carrier lifetimes of transistor devices lack the accuracy and the short determination times desired in the fabrication process.

Accordingly, what is needed in the art is an improved method for determining a device hot carrier lifetime with greater accuracy and for determining a device hot carrier lifetime that is accomplished in a shorter period of time and uses stress voltages that are closer to the device's operating voltage.

SUMMARY OF THE INVENTION

To address the above-discussed deficiencies of the prior art, the present invention provides a method for determining a hot carrier lifetime of a transistor. In one embodiment, the method comprises determining an initial transistor characteristic of the transistor that is affected by hot carrier aging; then applying a stress voltage to the transistor to cause the initial transistor characteristic to change wherein the stress voltage does not exceed a maximum breakdown voltage of the transistor; and then determining a change in the initial transistor characteristic, with a hot carrier lifetime of the transistor being a function of initial transistor characteristic and the change in the initial transistor characteristic. In another aspect of this particular embodiment, determining an initial transistor characteristic includes determining an initial transconductance ($g_{m1}$) of a transistor, and then, applying a stress voltage, which does not exceed a maximum breakdown voltage of the transistor, to the transistor to cause a transconductance degradation of the transistor, and then determining a subsequent transconductance ($g_{m2}$) of the transistor. A hot carrier lifetime of the transistor can then be determined as a function of $g_{m1}$ and $g_{m2}$.

Thus, the present invention provides a method in which the hot carrier lifetime is determined from sequential transconductance measurements without intervening, other transistor characteristic tests conducted between the transconductance measurements. As discussed below, the present invention provides a method that allows for an accurate determination of the hot carrier lifetime within a very short period of time, (e.g., from about 0.001 seconds to about 100 seconds). This method, therefore, can be used to monitor the hot carrier lifetime quality of the devices as they are fabricated without substantial increases in production downtime typically required to make hot carrier lifetime measurements.

In one embodiment, the step of determining includes the step of determining the $g_{m1}$ as a function of a first source/drain current within a linear region of the transistor with respect to a first gate voltage. In another embodiment, the method may further include the step of applying the stress voltage to the transistor to cause further degradation of the transistor subsequent to the step of determining said $g_{m2}$.

In yet another embodiment, the step of determining includes the step of determining the $g_{m2}$ as a function of a second source/drain current within a linear region of the transistor with respect to a second gate voltage.

In an advantageous embodiment, the stress voltage does not exceed about a maximum operating voltage of the transistor and a preferred stress voltage is a maximum operating voltage of the transistor. However, it should be understood that the stress voltage may also be about a normal operating voltage of the transistor.

In another advantageous embodiment, the transconductance degradation initially increases, then saturates and again increases during a time interval ranging from about 0.001 seconds to about 100 seconds. It is within this time interval that the hot carrier lifetime can be determined. In another aspect of this particular embodiment, the transconductance degradation saturates during a time interval ranging from about 0.001 seconds to about 10 seconds. In yet another aspect, the transconductance degradation increases linearly on a log plot from about 0.001 seconds to about 0.01 seconds.

In another embodiment, the stress voltage is applied for a time interval ranging from about 0.001 second to about 100 seconds, and in another aspect, the stress voltage is applied for a time interval ranging from about 0.01 second to about 100 seconds. In a further embodiment, the stress voltage is applied for a time interval ranging from about 0.01 seconds to about 10 seconds. As seen from these short periods of time, the hot carrier lifetime can be quickly determined to provide current feedback to the production lines with little or no downtime as compared to prior art methods.

In another embodiment, the method further comprises the steps of again applying the stress voltage to the transistor to cause further degradation of the transistor subsequent to the step of determining said $g_{m2}$, and determining a transconductance ($g_{m3}$) of the transistor wherein the stress voltage remains substantially constant in determining $g_{m1}$, $g_{m2}$ and $g_{m3}$.

In yet another embodiment, the present invention provides a method of fabricating a semiconductor device having transistors formed thereon. In addition to the various embodiments discussed above, this particular method further includes providing a semiconductor wafer substrate and forming a transistor on the semicondutor substrate. The hot carrier lifetime is determined as previously discussed for other embodiments. In addition, however, after the hot carrier lifetime is determined using the method of the present invention, the transistor is either rejected for shipping purposes if the hot carrier lifetime falls outside of the desired transistor design parameters or is accepted for shipping purposes if the hot carrier lifetime falls within the desired transistor design parameters.

The foregoing has outlined, rather broadly, preferred and alternative features of the present invention so that those who are skilled in the art may better understand the detailed description of the invention that follows. Additional features of the invention that form the subjects of the present invention's claims are described below. Those who are skilled in the art should appreciate that they can readily use the disclosed conception and specific embodiment as a basis for designing or modifying other structures for carrying out the same purposes of the present invention. Those who are skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
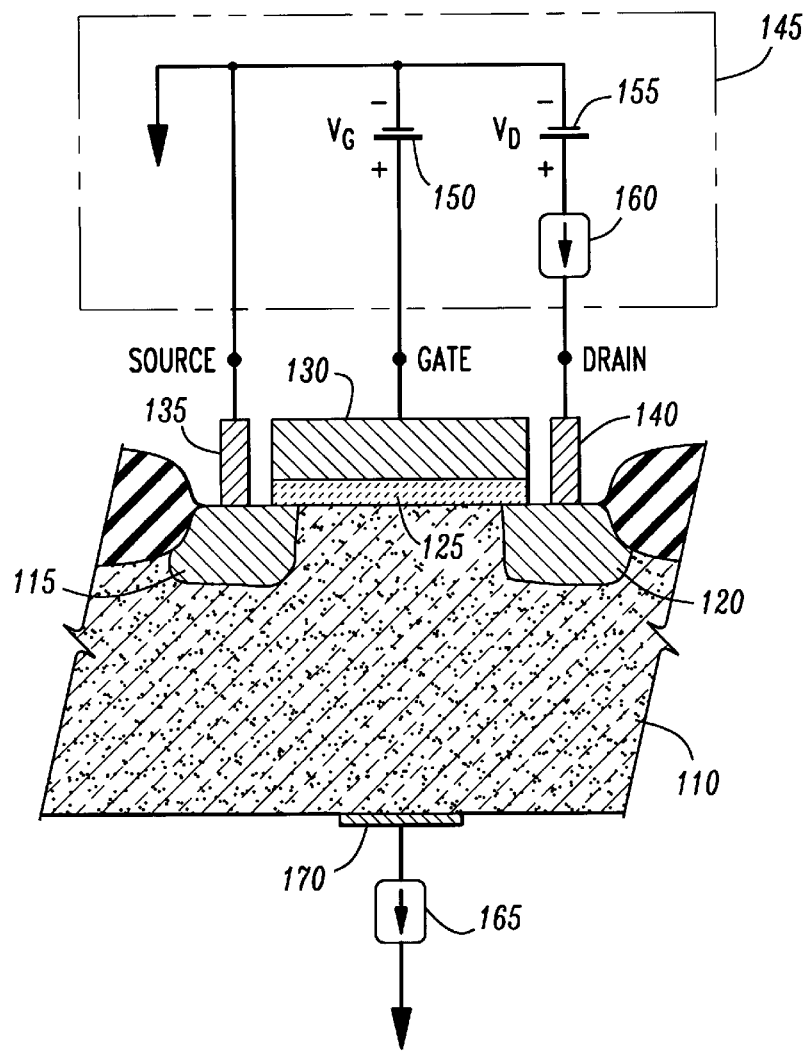
FIG. 1 illustrates a cross-sectional view of an exemplary semiconductor device and associated test equipment that provides a suitable environment to describe the practice of the present invention.

Referring initially to FIG. 1, illustrated is a cross-sectional view of an exemplary semiconductor device and associated test equipment that provides a suitable environment to describe the practice of the present invention. In the illustrated embodiment, a substrate 110 is shown wherein source and drain regions 115, 120, respectively, are formed. In an advantageous embodiment, the source and drain regions 115, 120 are conventionally formed with lightly doped regions at the channel edges to reduce electric fields. Source and drain contacts 135, 140 are also shown above the source and drain regions 115, 120 that provide electrical contact points for the semiconductor device. A gate oxide layer 125 overlies the channel region and a gate 130 overlies the channel and gate oxide layer 125. As with the source and drain contacts 135, 140, the gate 130 also provides an electrical contact point for the semiconductor device.

The gate 130 and the drain contact 140 are coupled to gate and drain voltage sources 150, 155, respectively, while the source contact 135 is coupled to ground. It should be noted that the connections between the semiconductor device and external devices, e.g., voltage sources and measurement devices, are typically accomplished using conventional test probes. In addition to the drain voltage source 155, a first current measuring device 160, such as a conventional current meter, is coupled to the drain contact 140. In an advantageous embodiment, the gate and drain voltage sources 150, 155 and the first measuring device 160 are collectively part of an automatic test equipment (ATE) 145 such as a Hewlett-Packard HP4145B Semiconductor Parameter Analyzer. On the underside of the semiconductor device, a body region (designated node 170) is coupled to ground via a second current measuring device 165 such as a conventional current meter. Those who are skilled in the art should readily appreciate that the second current measuring device 165 may also be part of the ATE 145 discussed above.

As previously discussed, determining a hot carrier lifetime of a device using the degradation of the device transconductance characteristic generally requires a significant amount of time. Alternatively, it has been previously thought that the extremely high voltages were necessary to achieve accurate hot carrier lifetime measurements. The present invention recognizes that an accurate determination of a hot carrier lifetime from transconductance measurements may be accomplished in a shorter period of time than what is currently required by intervening tests.

It is believed that due to the sensitivity of a transconductance characteristic of a semiconductor device, the intervening, transistor characteristic tests "mask" the subsequent transconductance measurement, i.e., very little or no degradation will be indicated, unless extremely high voltages are used. As such, to overcome this masking effect, the subsequent stress is performed at an elevated stress level (higher stress voltages are employed) or the stress voltages are kept at or near the device's operating voltage but the stress voltages are employed for a longer period of time in present methods. In either case, the higher stress voltages are not necessarily accurate and the longer period of time is undesirable. The present invention discloses a method in which the hot carrier lifetime of a semiconductor device is determined from sequential transconductance measurements without intervening, transistor characteristic tests conducted between the transconductance measurements. The method disclosed by the present invention may be explained in greater detail by referring to FIG. 2, with continuing reference to FIG. 1.

Figure 2:
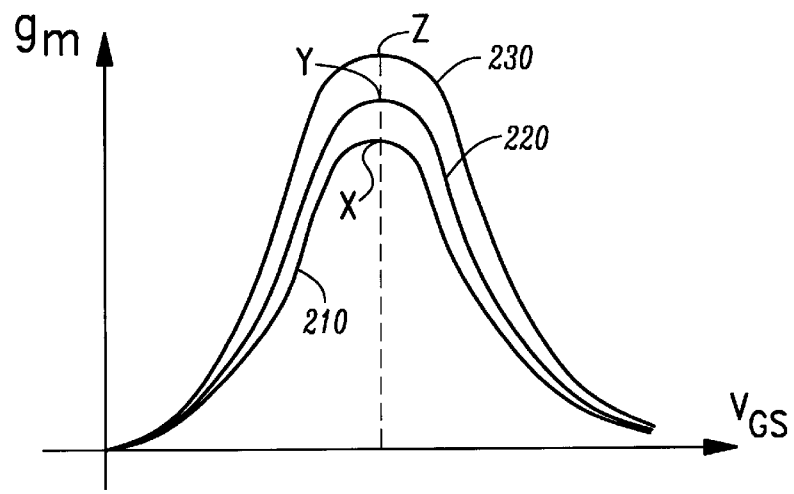
FIG. 2 illustrates an exemplary graph of measured transconductance ($g_m$) values versus gate voltages ($V_{GS}$) of a semiconductor device.

Turning now to FIG. 2, illustrated is an exemplary graph of measured transconductance ($g_m$) values versus gate voltages ($V_{GS}$) of a semiconductor device. A first curve 210 is obtained by "sweeping" the gate voltage source 150 from an initial value of zero to the semiconductor device operating voltage, e.g., 5V, while maintaining a constant $V_{DS}$, i.e., the drain voltage source 155 is held constant at about 0.1 or 0.2 V. As the $V_{GS}$ is varied from zero to the device's operating voltage, drain current ($I_{DS}$) values are obtained, using the first current measuring device 160, for the increasing gate voltage. In an advantageous embodiment, the application of the bias voltages ($V_{GS}$ and $V_{DS}$) and measurement of the $I_{DS}$ are implemented with software executable code in a microprocessor based testing environment. An initial or first transconductance value $g_{m1}$ is then determined using the following relationship:

$$g_m = \partial I_{DS}/\partial V_{GS} \tag{1}$$

In an advantageous embodiment, the $g_m$(max) values are from the peak of the first curve 210 (designated X). Those who are skilled in the art should readily appreciate that the $g_m$ values may also be obtained from any point on the first curve 210. The present invention does not contemplate limiting using $g_m$ values from any one particular location along the first curve 210.

Following the determination of the first transconductance value $g_{m1}$, a stress voltage is applied to the semiconductor device to facilitate the degradation of the semiconductor device's transconductance characteristic. In one embodiment, the stress conditions include setting the drain voltage source 155 at the device's operating voltage, e.g., 5V, and setting the gate voltage source to about 40% of the $V_{DS}$ (about 2V) for a time interval ranging from about 0.001 seconds to about 100 seconds. In another embodiment, the time interval ranges from about 0.001 seconds to about 10 seconds. In yet another embodiment, the time interval ranges from about 0.001 seconds to about 0.01 seconds. In one advantageous embodiment, the stress voltage applied does not exceed the maximum breakdown voltage of the device. In an alternative embodiment, the stress voltage does not exceed the maximum operating voltage. Those who are skilled will realize that the maximum breakdown voltage and the maximum operating voltage for the transistor will vary from device to device. For example, in a 3.3 volt technology, the operating voltage is 3.3 volts with a maximum operating voltage of approximately 3.6 volts and a breakdown voltage of about 5 volts. In a 5 volt technology, the operating voltage is 5.0 volts with a maximum operating voltage of approximately 5.5 volts and a breakdown voltage of about 10 volts. During the period when the stress voltage is being applied to the device, in an advantageous embodiment, another device characteristic, i.e., maximum substrate current or $I_{SUB}$(max), may also be obtained using the second current measuring device 165.

After the stress voltages have been removed from the device, a second transconductance value $g_{m2}$ is determined. Using the same voltages ($V_{DS}$ and $V_{GS}$) and procedures as were used in the determination of the first transconductance value $g_{m1}$ above, a second curve 220 is obtained. Again, in an advantageous embodiment, the values $g_m$ values are obtained from a point designated Y (peak $g_m$) on the second curve 220.

At this point, there are two transconductance values, i.e., $g_{m1}$ and $g_{m2}$. It has been observed that after about 10 seconds of stress a device's hot carrier degradation characteristic begins to assume a form that substantially mirrors the degradation characteristic obtained when longer periods of stress and/or higher stress voltages are employed. The functional dependance of the transconductance degradation data obtained after about 10 seconds of stress is almost identical to transconductance degradation data obtained with longer term, e.g., days or months, tests. The relationship between degradation data obtained with short term testing (the present invention) and longer term testing (conventional) may be described in greater detail by referring to FIG. 3.

Figure 3:
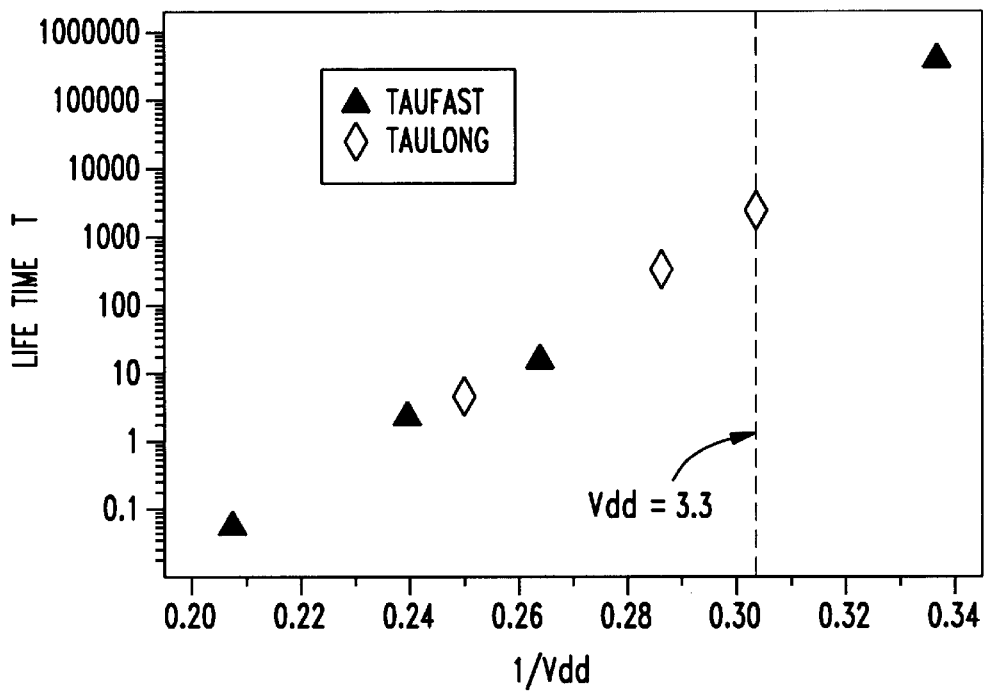
FIG. 3 illustrates an exemplary graph of a device's lifetime ($\tau$) versus 1/Vdd (where Vdd is the device's operating voltage)

Turning now to FIG. 3, illustrated is an exemplary graph of a device's lifetime ($\tau$) versus 1/Vdd (where Vdd is the device's operating voltage). The results of the device's lifetime characteristic using short term and long term testing are designated TauFast and TauLong, respectively. The graph illustrates that slopes of both short term and long term test results are almost identical. The graph illustrates that the short test provides identical lifetime information as the long term test. For example, the lifetimes are the same at 3.3V.

Referring back to FIGS. 1 and 2, after the second transconductance value $g_{m2}$ has been calculated, the method described above may be repeated to determine a third transconductance value $g_{m3}$. Using the same voltages ($V_{DS}$ and $V_{GS}$) and procedures as were used in the determination of the first and second transconductance values above, a third curve 230 is obtained. Again, in an advantageous embodiment, the values $g_m$ values are obtained from a point designated Z on the third curve 230. Following the determination of the third transconductance value $g_{m3}$, the hot carrier lifetime of the device is then calculated by mathematically extrapolating the $g_{m1}$, $g_{m2}$ and $g_{m3}$ values to the desired degradation criteria, e.g., 15%. It should be readily apparent to those who are skilled in the art that the mathematical extrapolation to the desired degradation value may also be accomplished with two transconductance values, i.e., $g_{m1}$ and $g_{m2}$.

Figure 4:
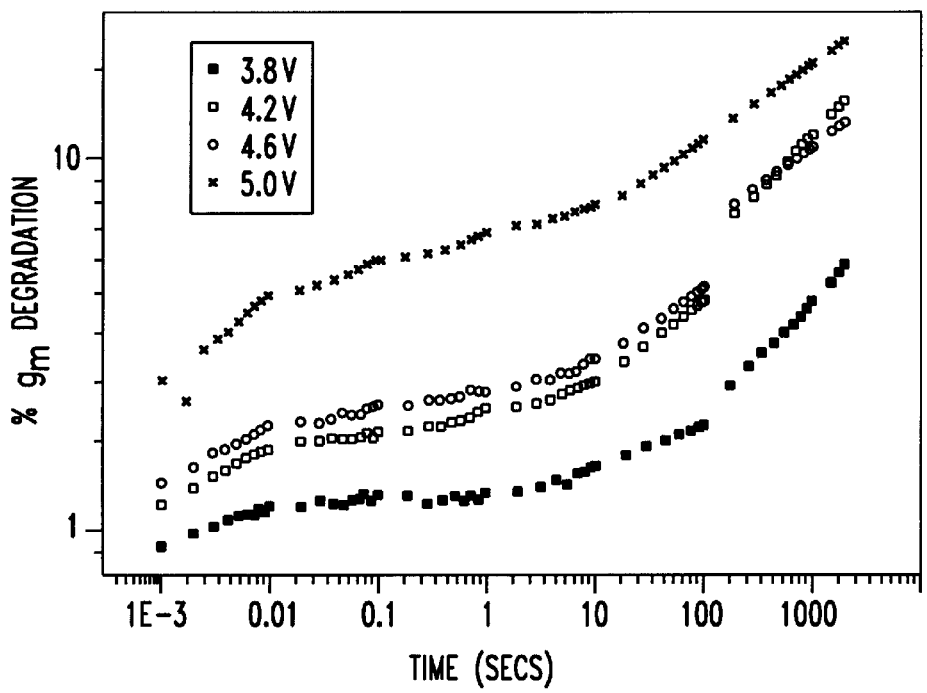
FIG. 4 illustrates percentage degradation in transconductance, as a function of time, for different values of drain bias voltage ($V_{DS}$) under conditions of maximum substrate current ($V_{GS} \cong V_{DS}/2$)

Turning now to FIG. 4, illustrated are percentage degradation in transconductance, as a function of time, for different values of drain bias voltage ($V_{DS}$) under conditions of maximum substrate current ($V_{GS} = V_{DS}/2$). From the illustration, it can be seen that there is a clear deviation from a normally observed power law expression $t^n$ (where t is time and n is a constant) even at times less than 1 second. However, the identical slopes of the initial degradation up to 0.01 seconds and the degradation subsequent to 10 seconds indicate that the mechanism is similar for the two regions. The slopes in these two regions do not vary with changes in the drain stress voltage and follow the forms that are obtained when conventional "long-term" tests are employed.

Figure 5:
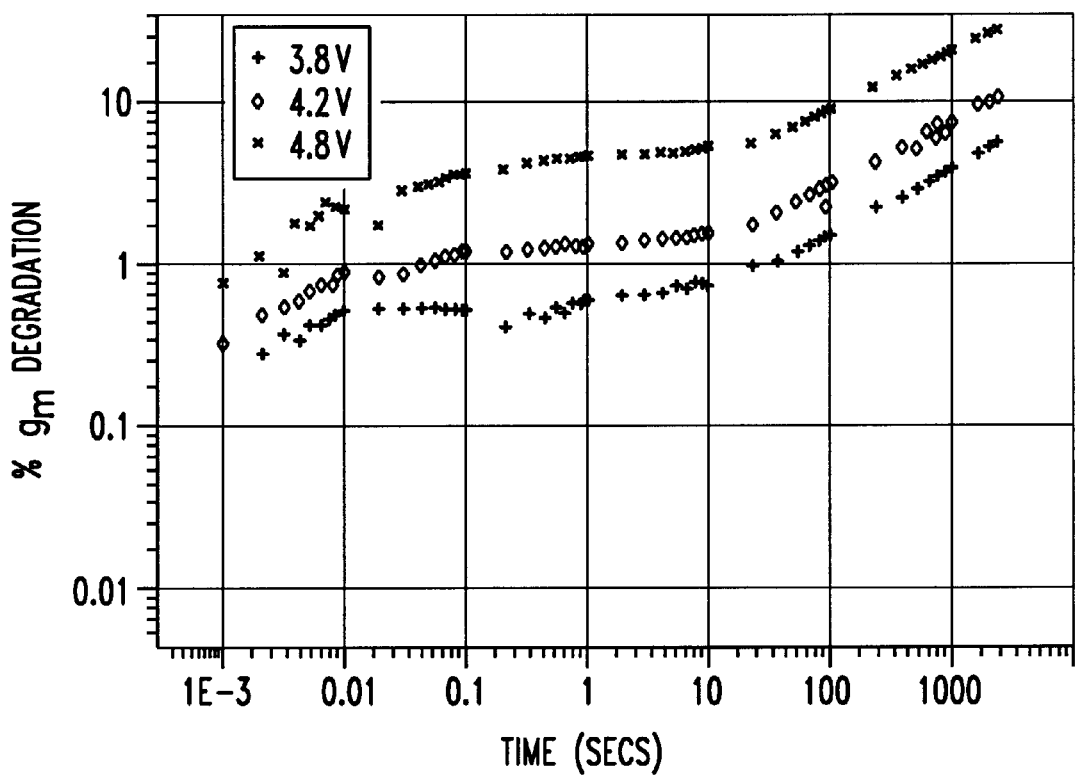
FIG. 5 illustrates percentage degradation in transconductance, as a function of time, for different values of the drain bias voltage ($V_{DS}$) where $V_{GS} = V_{DS}$.

Turning now to FIG. 5, illustrated are percentage degradation in transconductance, as a function of time, for different values of the drain bias voltage ($V_{DS}$) where $V_{GS} = V_{DS}$. The slopes of the curves appear to indicate the same qualitative behavior shown in the slopes of the curves illustrated in FIG. 4. This similarity shows that the degradation characteristics do not vary for different substrate current bias conditions.

The present invention provides a testing methodology to determine a device's hot carrier lifetime that is substantially shorter than traditional techniques. Furthermore, unlike conventional techniques that employ intervening tests and require high stress voltages (in excess of the device's operating voltage) to accelerate degradation of a device's characteristic, the present invention provides a method where sequential transconductance measurements are taken. These measurements are taken without intervening steps that mask or degrade the transconductance's sensitivity. As a result, more accurate and quicker transconductance measurements may be taken without the necessity of subjecting the device to near breakdown voltages. Also, by reducing the testing period, the implementation of the method disclosed by the present invention provides a wafer screen in the manufacturing environment. Presently, a device's lifetime characteristic is not directly monitored during the manufacturing process. The device's $I_{SUB}$ characteristic is monitored but does not directly measure the device's failure time. Thus, other effects that may impact hot carrier degradation may not be screened, e.g., oxide quality. There may be circumstances where an above-specification $I_{SUB}$ value may not imply poor reliability. In these circumstances, good semiconductor wafers may be scrapped. The present invention with its shortened testing period provides data, i.e., device's lifetime, that has significant impact with respect to the device's reliability.

From the foregoing it can be seen that the present invention provides a method for determining a hot carrier lifetime of a transistor. In one embodiment, the method comprises the steps of determining an initial transconductance ($g_{m1}$) of a transistor, and then, applying a stress voltage, which does not exceed a maximum breakdown voltage of the transistor, to the transistor to cause a transconductance degradation of the transistor, and then determining a subsequent transconductance ($g_{m2}$) of the transistor. A hot carrier lifetime of the transistor can then be determined as a function of $g_{m1}$ and $g_{m2}$.

Although the present invention has been described in detail, those who are skilled in the art should understand that they can make various changes, substitutions and alterations herein without departing from the spirit and scope of the invention in its broadest form.

What is claimed is:

1. A method for determining a hot carrier lifetime of a transistor, comprising:

determining an initial transconductance ($g_{m1}$) of a transistor; then applying a stress voltage to said transistor to cause a transconductance degradation of said transistor, said stress voltage not exceeding a maximum breakdown voltage of said transistor; then determining a subsequent transconductance ($g_{m2}$) of said transistor, a hot carrier lifetime of said transistor being a function of said $g_{m1}$ and said $g_{m2}$.

2. The method as recited in claim 1 wherein said breakdown voltage ranges from about 4.8 volts to about 3.3 volts.

3. The method as recited in claim 1 wherein determining an initial transconductance ($g_{m1}$) includes determining said $g_{m1}$ as a function of a first source/drain current within a linear region of said transistor with respect to a first gate voltage.

4. The method as recited in claim 1 wherein determining a subsequent transconductance ($g_{m2}$) includes determining said $g_{m2}$ as a function of a second source/drain current within a linear region of said transistor with respect to a second gate voltage.

5. The method as recited in claim 1 further comprising:

again applying said stress voltage to said transistor to cause further degradation of said transistor subsequent to said determining a $g_{m2}$; and determining a transconductance ($g_{m3}$) of said transistor, said stress voltage remaining substantially constant in determining said $g_{m1}$, $g_{m2}$ and $g_{m3}$.

6. The method as recited in claim 1 further comprising applying said stress voltage to said transistor to cause further degradation of said transistor subsequent to determining a subsequent transconductance ($g_{m2}$) of said transistor.

7. The method as recited in claim 1 wherein said stress voltage does not exceed about a maximum operating voltage of said transistor.

8. The method as recited in claim 7 wherein said maximum operating voltage ranges from about 3.6 volts to about 3.3 volts.

9. The method as recited in claim 1 wherein said transconductance degradation saturates during a time interval ranging from about 0.001 seconds to about 100 seconds, said hot carrier lifetime determined from this time interval.

10. The method as recited in claim 9 wherein said transconductance degradation saturates during a time interval ranging from about 0.001 seconds to about 10 seconds, said hot carrier lifetime determined from this time interval.

11. The method as recited in claim 9 wherein said transconductance degradation saturates from about 0.001 seconds to about 0.01 seconds.

12. The method as recited in claim 1 wherein said stress voltage is applied for a time interval ranging from about 0.001 second to about 100 seconds.

13. The method as recited in claim 12 wherein said stress voltage is applied for a time interval ranging from about 0.001 second to about 10 seconds.

14. The method as recited in claim 12 wherein said stress voltage is applied for a time interval ranging from about 0.001 seconds to about 0.01 seconds.

15. A method for determining a hot carrier lifetime of a transistor, comprising:

determining an initial transconductance ($g_{m1}$) of a transistor, said $g_{m1}$ being a function of a first source/drain current within a linear region of said transistor with respect to a first gate voltage; then applying a stress voltage to said transistor to cause a transconductance degradation of said transistor, said stress voltage not exceeding a maximum breakdown voltage of said transistor; then determining a subsequent transconductance ($g_{m2}$) of said transistor, said $g_{m2}$ being a function of a second source/ drain current within said linear region with respect to a second gate voltage, a hot carrier lifetime of said transistor being a function of said $g_{m1}$ and said $g_{m2}$.

16. The method as recited in claim 15 wherein said maximum breakdown voltage ranges from about 9.6 volts to about 5.5 volts.

17. The method as recited in claim 15 further comprising applying said stress voltage to said transistor to cause further degradation of said transistor subsequent to determining said $g_{m2}$.

18. The method as recited in claim 15 wherein said maximum breakdown voltage does not exceed about a maximum operating voltage of said transistor.

19. The method as recited in claim 15 wherein said maximum operating voltage ranges from about 3.6 volts to about 3.3 volts for a 3 volt technology and from about 5 volts to 5.5 volts for a 5 volt technology.

20. The method as recited in claim 15 wherein said transconductance degradation saturates during a time interval ranging from about 0.001 seconds and about 100 seconds, said hot carrier lifetime determined from this time interval.

21. The method as recited in claim 20 wherein said transconductance degradation saturates during a time interval ranging from about 0.001 seconds and about 10 seconds, said hot carrier lifetime determined from this time interval.

22. The method as recited in claim 20 wherein said transconductance degradation saturates between about 0.001 seconds and about 0.01 seconds.

23. The method as recited in claim 15 further comprising:
    again applying said stress voltage to said transistor to cause further degradation of said transistor subsequent to said step of determining said $g_{m2}$;
    and determining a transconductance ($g_{m3}$) of said transistor.

24. The method as recited in claim 15 wherein said stress voltage is applied for a time interval ranging from about 0.001 second to about 100 seconds.

25. The method as recited in claim 24 wherein said stress voltage is applied for a time interval ranging from about 0.001 second to about 10 seconds.

26. The method as recited in claim 24 wherein said stress voltage is applied for a time interval ranging from about 0.001 seconds to about 0.01 seconds.

27. The method as recited in claim 15 wherein said first drain/source current is substantially equal to said second drain/source current.

28. A method of fabricating a semiconductor device having transistors formed thereon, comprising:
    providing a semiconductor wafer substrate;
    forming a transistor on said semiconductor substrate;
    determining an initial transconductance ($g_{m1}$) of said transistor; then
    applying a stress voltage to said transistor to cause a transconductance degradation of said transistor, said stress voltage not exceeding a maximum breakdown voltage of said transistor; then
    determining a subsequent transconductance ($g_{m2}$) of said transistor, a hot carrier lifetime of said transistor being a function of said $g_{m1}$ and said $g_{m2}$; and
    rejecting said transistor when said hot carrier lifetime falls outside of desired transistor design parameters or accepting said transistor when said hot carrier lifetime falls within said desired transistor design parameters.

29. The method as recited in claim 28 wherein said stress voltage is applied for a time interval ranging from about 0.001 seconds to about 0.01 seconds.

30. The method as recited in claim 28 wherein said breakdown voltage ranges from about 4.8 volts to about 3.3 volts.

31. The method as recited in claim 28 wherein determining an initial transconductance ($g_{m1}$) includes determining said $g_{m1}$ as a function of a first source/drain current within a linear region of said transistor with respect to a first gate voltage.

32. The method as recited in claim 28 wherein determining a subsequent transconductance ($g_{m2}$) includes determining said $g_{m2}$ as a function of a second source/drain current within a linear region of said transistor with respect to a second gate voltage.

33. The method as recited in claim 28 further comprising:
    again applying said stress voltage to said transistor to cause further degradation of said transistor subsequent to said determining a $g_{m2}$; and
    determining a transconductance ($g_{m3}$) of said transistor, said stress voltage remaining substantially constant in determining said $g_{m1}$, $g_{m2}$ and $g_{m3}$.

34. The method as recited in claim 28 further comprising applying said stress voltage to said transistor to cause further degradation of said transistor subsequent to determining a subsequent transconductance ($g_{m2}$) of said transistor.

35. The method as recited in claim 28 wherein said stress voltage does not exceed about a maximum operating voltage of said transistor.

36. The method as recited in claim 35 wherein said maximum operating voltage ranges from about 3.6 volts to about 3.3 volts.

37. The method as recited in claim 28 wherein said transconductance degradation saturates during a time interval ranging from about 0.001 seconds to about 100 seconds, said hot carrier lifetime determined from this time interval.

38. The method as recited in claim 37 wherein said transconductance degradation saturates during a time interval ranging from about 0.001 seconds to about 10 seconds, said hot carrier lifetime determined from this time interval.

* * * * *